United States Patent
Hyun et al.

(10) Patent No.: US 7,053,006 B2
(45) Date of Patent: May 30, 2006

(54) METHODS OF FABRICATING OXIDE LAYERS BY PLASMA NITRIDATION AND OXIDATION

(75) Inventors: Sang-jin Hyun, Kyungki-do (KR); Sug-hun Hong, Kyungki-do (KR); Yu-gyun Shin, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 150 days.

(21) Appl. No.: 10/408,630

(22) Filed: Apr. 7, 2003

(65) Prior Publication Data

US 2004/0092133 A1    May 13, 2004

(30) Foreign Application Priority Data

Nov. 11, 2002    (KR) ...................... 10-2002-0069661

(51) Int. Cl.
*H01L 21/31* (2006.01)
*H01L 21/336* (2006.01)

(52) U.S. Cl. .................. 438/761; 438/270; 438/271

(58) Field of Classification Search ................ 438/270, 438/271
See application file for complete search history.

(56) References Cited

U.S. PATENT DOCUMENTS

| | | | |
|---|---|---|---|
| 5,668,054 A | 9/1997 | Sun et al. ................... 438/653 |
| 6,153,519 A | 11/2000 | Jain et al. ................... 438/681 |
| 6,204,204 B1 | 3/2001 | Paranjpe et al. ............ 438/785 |
| 6,727,142 B1 * | 4/2004 | Gluschenkov et al. ...... 438/246 |
| 6,730,566 B1 * | 5/2004 | Niimi et al. ................. 438/275 |
| 6,780,788 B1 * | 8/2004 | Chen et al. .................. 438/758 |

FOREIGN PATENT DOCUMENTS

| | | | |
|---|---|---|---|
| JP | 2001-291866 | * | 10/2001 |
| JP | 2001-291866 A | | 10/2001 |

OTHER PUBLICATIONS

Notice to Submit Response, KR Application No. 2002-0069661, Aug. 30, 2004.
Jin-Seong Park et al., "Plasma-Enhanced Atomic Layer Deposition of Tantalum Nitrides Using Hydrogen Radicals as a Reducing Agent", Electrochemical and Solid State Letters, 4 (4) C17-C19 (2001).

* cited by examiner

*Primary Examiner*—Chuong Anh Luu
(74) *Attorney, Agent, or Firm*—Myers Bigel Sibley & Sajovec

(57) ABSTRACT

Oxide layers, including gate oxide layers having different thicknesses, are formed, plasma nitridized, and oxidized in an oxygen atmosphere containing hydrogen at a high temperature. Electron trap sites and stress occurring during plasma nitridation may be removed during oxidation.

15 Claims, 7 Drawing Sheets

METHODS OF FABRICATING OXIDE LAYERS BY PLASMA NITRIDATION AND OXIDATION

RELATED APPLICATION

This application claims the benefit of Korean Patent Application No. 2002-0069661, filed Nov. 11, 2002, the disclosure of which is hereby incorporated herein by reference in its entirety as if set forth fully herein.

FIELD OF THE INVENTION

The present invention relates to methods of fabricating semiconductor devices, and more particularly to methods of forming oxide layers such as gate oxide layers

BACKGROUND OF THE INVENTION

With the growing diversity of semiconductor devices, the device characteristics also may become diverse. For example, devices in which logic devices or Central Processing Units (CPUs) are merged with Dynamic Random Access Memories (DRAMs) or Static Random Access Memories (SRAMs) are being developed and marketed. In such devices, gate oxide layers having different thicknesses may be formed within a single chip in order to maintain each of the characteristics of the merged devices. Thus, a dual gate oxide layer composed of two different thicknesses or a multiple gate oxide layer composed of three or more thicknesses may be used.

Furthermore, gate oxide layers having different thicknesses may be formed in a single chip in order to vary an operating voltage in a device. For example, a gate oxide layer formed in an area in which an NMOS transistor is to be formed may be thicker than a gate oxide layer formed in an area in which a PMOS transistor is to be formed. Also, a gate oxide layer formed in a peripheral circuit area of a DRAM may be thicker than a gate oxide layer formed in a cell area of the DRAM.

As the integration density of semiconductor devices increases, gate oxide layers may be further scaled. Even though the thickness of the gate oxide layers may become thinner due to scaling, good electrical characteristics may need to be maintained. However, as the thickness of the gate oxide layers becomes thinner, a leakage current due to direct tunneling may increase, which may cause an increase in a standby current, the disturbance of a logic state, the deterioration of Time Dependent Dielectric Breakdown (TDDB) characteristics and/or other undesirable characteristics.

Accordingly, as is well known in the prior art, leakage current may be reduced by subjecting gate oxide layers to plasma nitridation. This plasma nitridation is performed to reduce the leakage current, to reduce the depletion of a polysilicon gate, to prevent boron (B) from penetrating the gate oxide layers from a gate doped with boron and/or for other purposes.

Plasma nitridation can generally achieve the above goals in a thin gate oxide layer having a thickness of 25 Å or less. However, when a dual gate oxide layer or a multiple gate oxide layer is to be formed, after plasma nitridation, leakage current may increase in a thick gate oxide layer that is formed to a thickness of 35 Å or more along with a thin gate oxide layer. In particular, a charge-to-breakdown (Qbd) value may be reduced to the level of 1/100 or less of the value prior to plasma nitridation. Thus, the reliability of the thick gate oxide layer may be very seriously deteriorated.

FIG. 1 is a graph illustrating variations in leakage current flowing through a thick gate oxide layer (40 Å) of an NMOS transistor after plasma nitridation. In FIG. 1, the horizontal axis and the vertical axis denote a gate voltage Vg and a gate leakage current density Jg, respectively. Curve (a), marked with a solid line, represents the density of leakage current flowing through a gate oxide layer formed using Rapid Thermal Oxidation (RTO). Leakage current flowing through the gate oxide layer after undergoing Remote Plasma Nitridation (RPN) is marked with (b). Curve (c), marked with a one-dot chain line, denotes the density of leakage current flowing through the gate oxide layer after undergoing Decoupled Plasma Nitridation (DPN).

Where a thin gate oxide layer having a thickness of about 20 Å undergoes RPN or DPN, the density of leakage current flowing through the thin gate oxide layer may decrease. However, in a case of a thick gate oxide layer having a thickness of about 40 Å, as seen in FIG. 1, the density of leakage current flowing through the thick gate oxide layer increases after RPN (b) and DPN (c). This phenomenon may be attributed to the formation of SiON due to incorporated nitrogen atoms when the thick gate oxide layer undergoes nitridation, which may result in a reduction in a band gap and an increase in electron trap sites.

In addition, as seen in FIG. 2, the Qbd value decreases in the thick gate oxide layer due to nitridation. FIG. 2 is a graph illustrating the Qbd value of the thick gate oxide layer measured before and after plasma nitridation. In FIG. 2, the horizontal axis and the vertical axis denote the Qbd value and a conventional Weibull distribution value, respectively. In other words, the vertical axis denotes cumulative failures. The current density J of the thick gate oxide layer is 0.005 A/cm$^2$ and the area of the thick gate oxide layer is 120000 μm$^2$.

Referring to FIG. 2, the Qbd value of the thick gate oxide layer after RPN (marked with black circles) and DPN (marked with black triangles) is reduced to 1/100 or less of the Qbd value of the thick gate oxide layer before plasma nitridation (marked with black squares). This appears to be because the electron trap sites are created due to silicon dangling bonds, bivalent nitrogen bonds and/or the like generated during plasma nitridation and then injected electrons are trapped in the electron trap sites, which may increase an intensity of a local electrical field, thereby causing a dielectric breakdown.

Ordinarily, an increase in the leakage current flowing through the thick gate oxide layer after plasma nitridation may not be considered a big problem. However, as shown in FIG. 2, the deterioration of the reliability of the thick gate oxide layer, represented by a reduction in the Qbd value, may not allow the application of plasma nitridation in the device, and thus may be very problematic. Therefore, reducing or preventing deterioration of the reliability of the thick gate oxide layer after plasma nitridation may be an important factor of determining whether plasma nitridation can actually be applied to a dual or a multiple gate oxide layer.

SUMMARY OF THE INVENTION

According to some embodiments of the present invention, there is provided a method of forming a gate oxide layer. Gate oxide layers having different thicknesses are formed on a substrate. The gate oxide layers having different thicknesses are subjected to plasma nitridation. The plasma nitridized gate oxide layers having different thicknesses are oxidized in an oxygen atmosphere containing hydrogen.

Thus, in some embodiments, good electrical characteristics of a thin gate oxide layer of gate oxide layers having different thicknesses may be maintained and the reliability of a thick gate oxide layer may be improved.

In some embodiments, oxidizing the plasma nitridized gate oxide layers may be performed at a temperature between about 700° C. and about 1000° C. and at a pressure between several and several tens of Torr using a gas mixture of hydrogen ($H_2$) and oxygen ($O_2$). In some embodiments, the gas mixture is diluted with nitrogen or an inert gas so that rapid oxidation can be prevented. In some embodiments, oxidizing the plasma nitridized gate oxide layers is performed for several to several tens of seconds.

It also will be understood that other embodiments of the invention may be used to form oxide layers other than gate oxide layers and/or may be used to form oxide layers of a single thickness. In these embodiments, an initial oxide layer is formed on a semiconductor substrate. The initial oxide layer is subjected to plasma nitridation and the plasma nitridized initial oxide layer is oxidized in an oxygen atmosphere containing hydrogen to form the oxide layer. In some embodiments, the initial oxide layer is at least about 35 Å thick.

DETAILED DESCRIPTION

Figure 1:
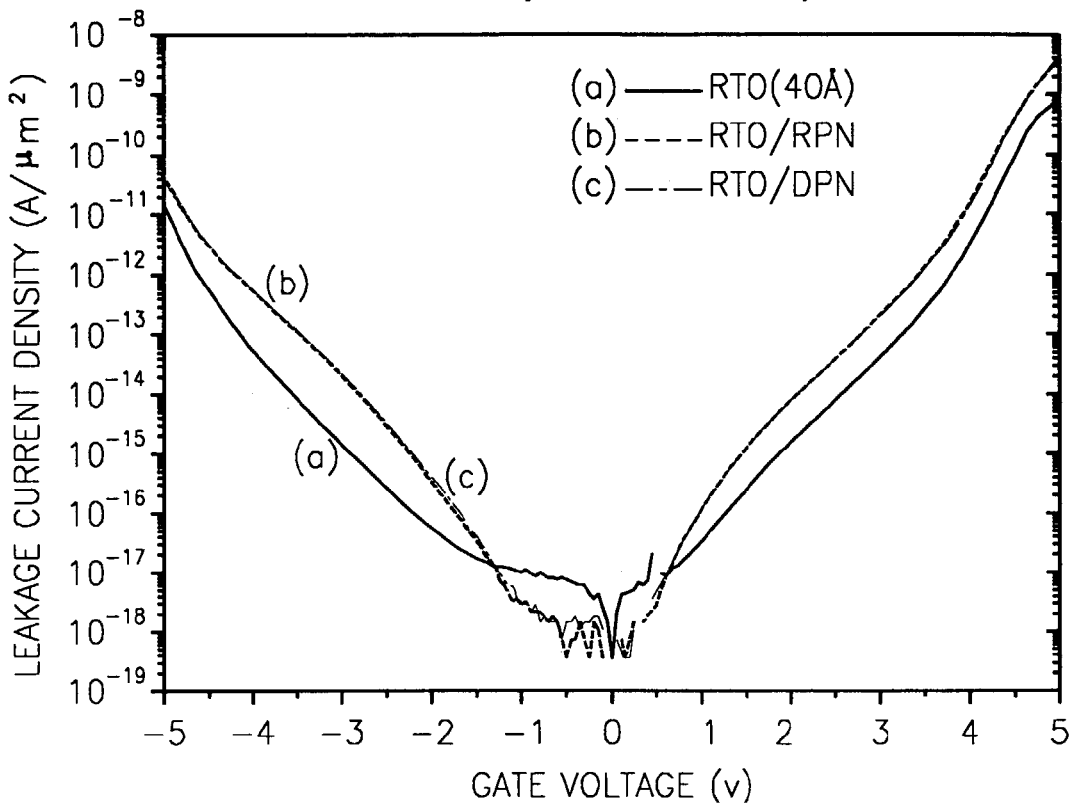
FIG. 1 is a graph illustrating variations in leakage current flowing through a thick gate oxide layer due to conventional plasma nitridation.
Figure 2:
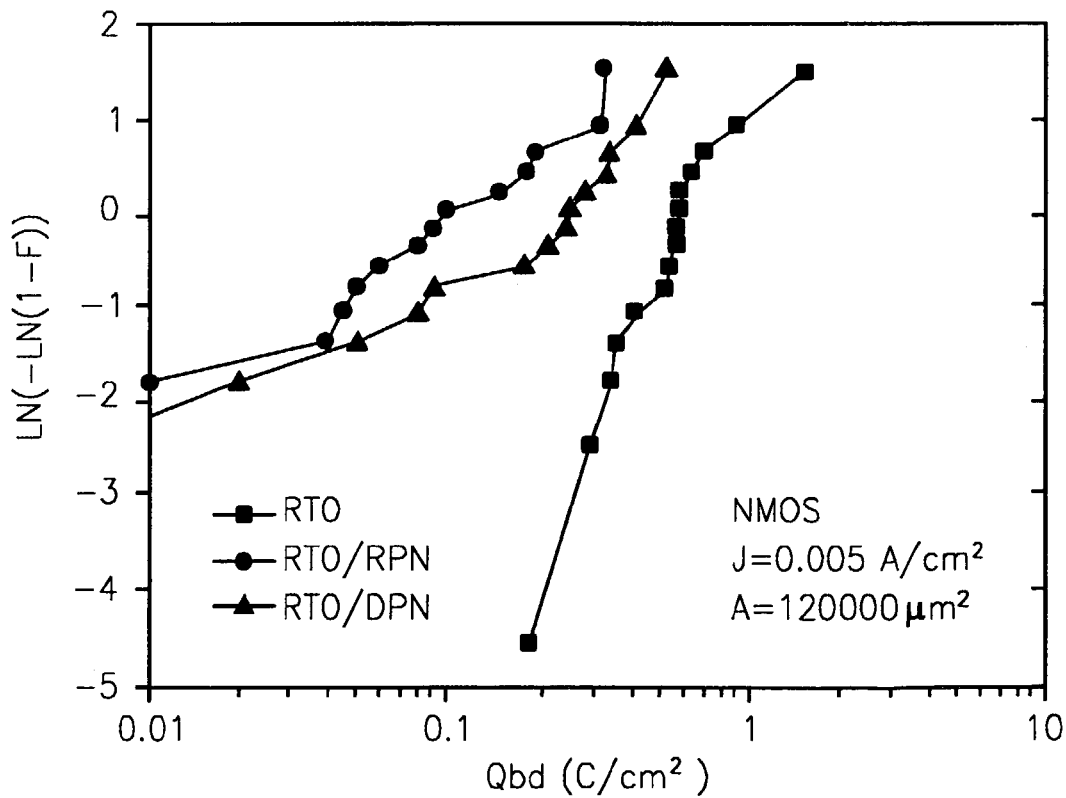
FIG. 2 is a graph illustrating a Qbd value of a thick gate oxide layer measured before and after conventional plasma nitridation.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

In methods of forming a gate oxide layer according to some embodiments of the present invention, a process of performing plasma nitridation to improve the efficiency of a thin gate oxide layer and to improve the reliability of a thick gate oxide layer may be used. According to some embodiments of the present invention, leakage current flowing through the thin gate oxide layer can be reduced and the reliability of the thick gate oxide layer can be improved. Embodiments according to the present invention also can improve the reliability of the thick gate oxide layer should also consider its effect on the thin gate oxide layer and not reduce the gain on the thin gate oxide layer that is obtained from plasma nitridation. In some embodiments of the present invention, a process of performing oxidation in an oxygen atmosphere containing hydrogen after plasma nitridation is used. It also will be understood that embodiments of the invention may be performed on oxide layers other than gate oxide layers and/or need not be performed on oxide layers having different thicknesses.

Figure 7:
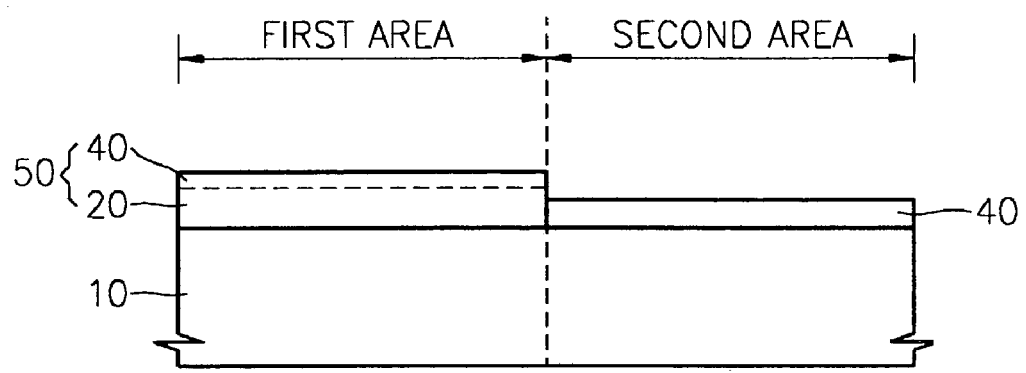
Figure 8:
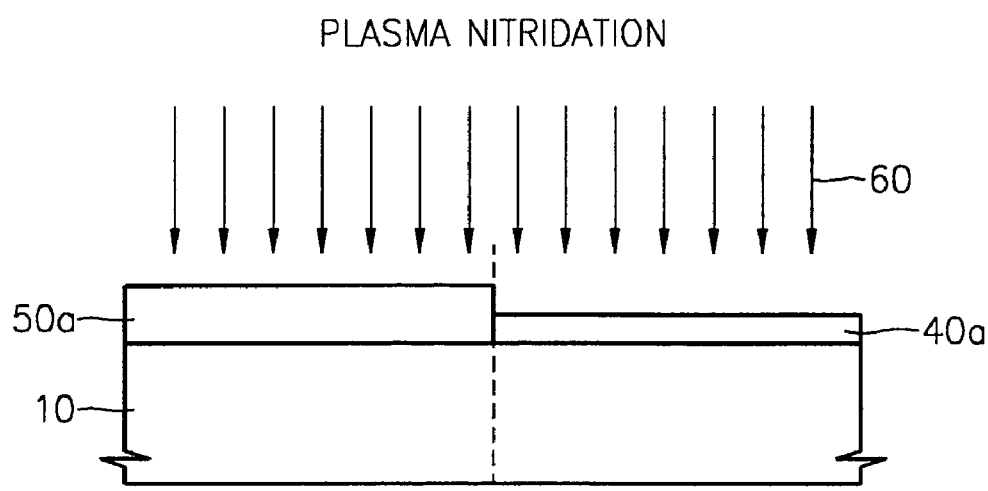
Figure 9:
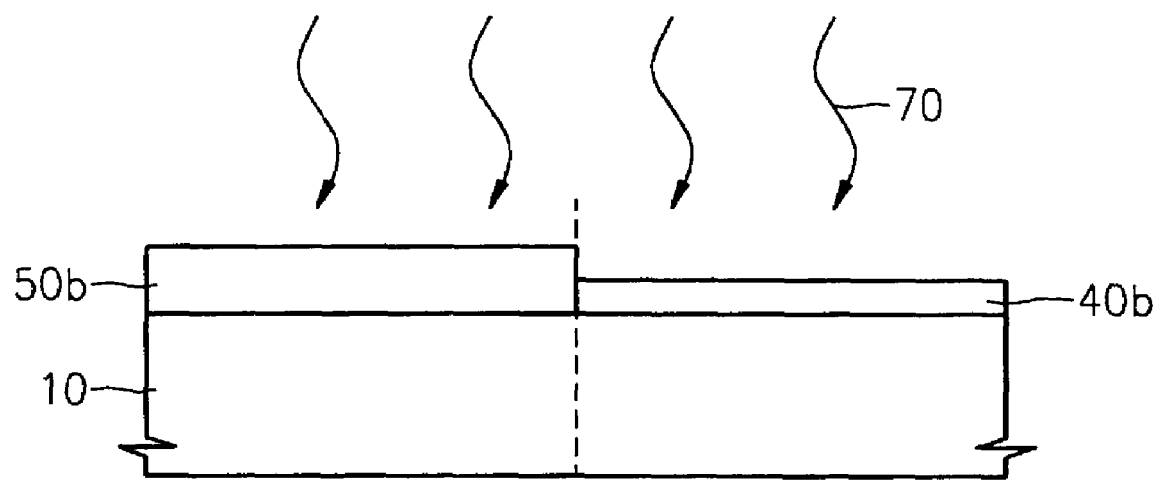
Figure 10:
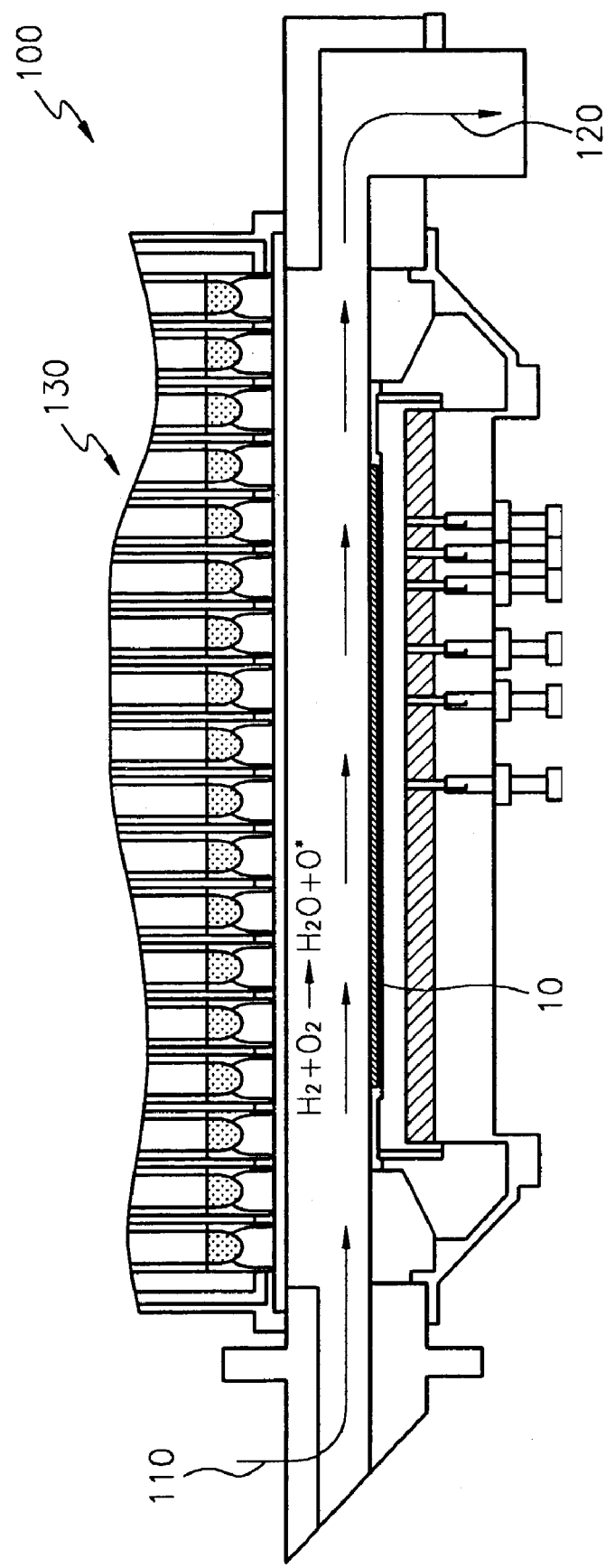
FIG. 10 is a schematic view of an In Situ Steam Generation (ISSG) apparatus that may be used for performing steps illustrated in FIG. 9.

FIGS. 3 through 9 are cross-sectional views explaining methods of forming a dual gate oxide layer according to embodiments of the present invention. FIG. 10 is a schematic view of an In Situ Steam Generation (ISSG) apparatus that can be used for performing a process as illustrated in FIG. 9.

Figure 3:
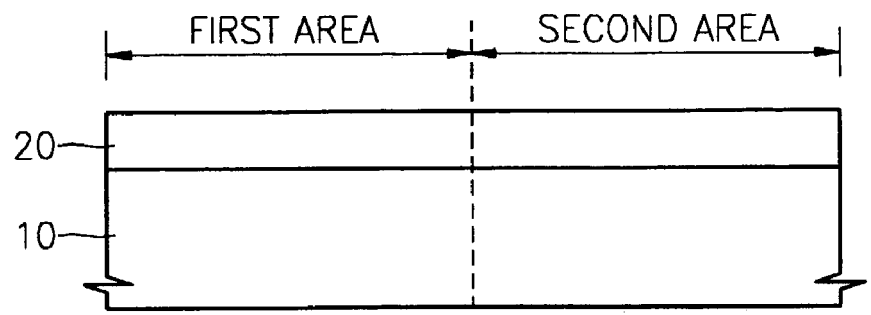
FIGS. 3 through 9 are cross-sectional views explaining methods of forming dual gate oxide layers according to some embodiments of the present invention.

Referring to FIG. 3, a first gate oxide layer 20 having a uniform thickness is formed on the entire surface of a substrate 10, in which a first area and a second area are defined. The first area is an area in which a thick gate oxide layer having a thickness of, for example, about 35 Å to about 45 Å is to be formed, and the second area is an area in which a thin gate oxide layer having a thickness of, for example, about 15 Å to about 25 Å is to be formed. For example, the first area may be an area in which an NMOS transistor is to be formed, and the second area may be an area in which a PMOS transistor is to be formed. Alternatively, the first area may be a peripheral circuit area of a DRAM and the second area may be a cell area of the DRAM. The substrate 10 has undergone several processes. For example, the substrate 10 may have undergone a process of forming an isolation layer, an ion implantation process, and the like.

In a case where the substrate 10 is a silicon substrate or a silicon epitaxial layer, the first gate oxide layer 20 may be formed by placing the substrate 10 in a Rapid Thermal Oxidation (RTO) atmosphere, a furnace thermal oxidation atmosphere, and/or a plasma oxidation atmosphere to form a silicon oxide layer on the surface of the substrate 10. In an event that RTO is used, the substrate 10 may be oxidized for several tens of seconds by maintaining the pressure of a gas at several tens of Torr and increasing the temperature of the substrate 10 to about 900° C. or higher. Heating is performed using infrared rays emitted from a tungsten halogen lamp or an arc lamp. For example, in a case where a silicon oxide layer having a thickness of about 18 Å is formed, oxidation is performed for about 33 seconds by maintaining the temperature of the substrate 10 at about 1025° C. and the pressure at about 12 Torr. In a case where a silicon oxide layer thicker than the above silicon oxide layer is to be formed, the temperature of the substrate 10 may be further increased and/or the time required for oxidation may be increased.

A second gate oxide layer to be formed in a subsequent process is stacked on the first gate oxide layer 20, and thus the first gate oxide layer 20 becomes a thick gate oxide layer of a dual gate oxide layer. Thus, the thickness of the first gate oxide layer 20 should be determined with such consideration. For example, if the thickness of a targeted gate oxide layer is about 45 Å, and the second gate oxide layer is formed to a thickness of about 15 Å, the first gate oxide layer 20 may be formed to a thickness of about 50 Å to about 55 Å considering that about 10 Å to about 15 Å of the thickness of the first gate oxide layer 20 may be removed in an intermediate cleaning process. If the cleaning process is not performed, the first gate oxide layer 20 may be formed to a thickness of about 35 Å to about 40 Å.

The first gate oxide layer 20 also may be formed by depositing a tantalum oxide layer ($Ta_2O_5$), a hafnium oxide layer ($HfO_2$), an aluminum oxide layer ($Al_2O_3$), and/or the like having a high dielectric constant, instead of the silicon oxide layer.

Figure 4:
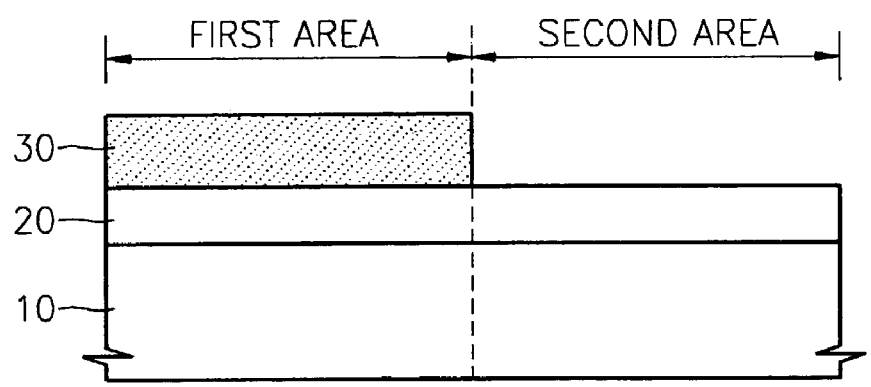

Next, referring to FIG. 4, a mask 30 is formed over a portion of the first gate oxide layer 20 to perform a process of forming a dual gate oxide layer. In some embodiments, the mask 30 is a photoresist mask, but it may comprise other masking materials. The photoresist mask is formed by coating the portion of the first gate oxide layer 20 with photoresist and then patterning the photoresist using an exposure and development process. The mask 30 covers the first area of the substrate 10 on which a thick gate oxide layer will be formed.

Figure 5:
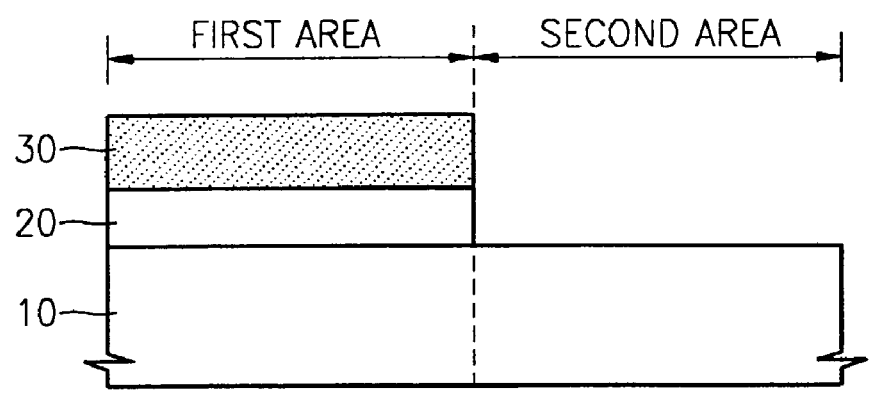

Thereafter, as shown in FIG. 5, only a portion of the first gate oxide layer 20 in the second area is selectively removed using the mask 30. As a result, only the patterned portion of the first gate oxide layer 20 remains in the first area. In some embodiments, the second area of the substrate 10 may be exposed filly by completely removing a portion of the first gate oxide layer 20 that is not protected by the mask 30. However, in other embodiments, the first gate oxide layer 20 that is not protected by the mask 30 may be partially removed, so that the remaining portion of the first gate oxide layer 20 serves as a buffer layer protecting the substrate 10 in a subsequent process.

Figure 6:
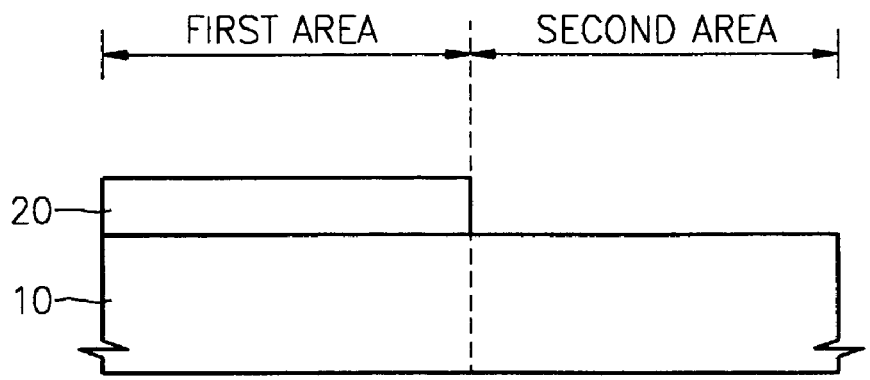

Next, as shown in FIG. 6, the mask 30 is removed. In a case where a portion of the first gate oxide layer 20 remains as the buffer layer in the second area, it can serve to prevent the second area of the substrate 10 from being damaged when removing the mask 30. If the mask 30 were a photoresist mask, the mask 30 may be removed by conventional ashing and stripping. In this process, the portion of the first gate oxide layer 20 remaining as the buffer layer is also removed to expose the second area of the substrate 10. After removing the mask 30, a cleaning process may be performed if desirable. The exposed portion of the first gate oxide layer 20 is also etched to a predetermined thickness, e.g., a thickness of about 10 Å to about 15 Å.

Referring to FIG. 7, reoxidation or the deposition of an oxide layer is performed again on the substrate 10 having the patterned portion of the first gate oxide layer 20 to form a second gate oxide layer 40 in the first area and the second area. As a result, in the first area, a thick gate oxide layer 50 is formed by combining a portion of the second gate oxide layer 40 with the remaining portion of the first gate oxide layer 20. In the second area, only a portion of the second gate oxide layer 40 exists, and thus a thin gate oxide layer is formed. Considering that the second gate oxide layer 40 may be further oxidized in a subsequent process, in some embodiments the second gate oxide layer 40 is formed about 5 Å to about 6 Å thinner than a finally targeted thin gate oxide layer. For example, if the finally targeted thin gate oxide layer has a thickness of about 15 Å to about 25 Å, the second gate oxide layer 40 is formed to a thickness of about 10 Å to about 19 Å. However, since the thick gate oxide layer 50 is barely oxidized in a subsequent process, the thickness of the thick gate oxide layer 50 barely varies. Thus, in some embodiments, the sum of the thickness of the first gate oxide layer 20 and the thickness of the second gate oxide layer 40 is equal to the thickness of the finally targeted thick gate oxide layer, e.g., a thickness of about 35 Å to about 45 Å.

Generally, the growth thickness of an oxide layer linearly increases as time passes, and from one point in time, slows down. That is, in a case where an oxide layer is grown to reach a predetermined thickness level, even if the oxide layer is further grown for the same period of time as the time spent to reach that point, the oxide layer grown after that point may be much thinner. Thus, the thickness of a portion of the second gate oxide layer 40 grown on the portion of the first gate oxide layer 20 formed in the first area is smaller than the thickness of a portion of the second gate oxide layer 40 grown in the second area of the substrate 10. For example, while a portion of the second gate oxide layer 40 is grown to a thickness of about 15 Å on the substrate 10 in the second area, a portion of the second gate oxide layer 40 is grown to a thickness of about 5 Å on the first gate oxide layer 20 in the first area. However, this may depend on conditions. In the previous step of forming the first gate oxide layer 20, the thickness of the first gate oxide layer 20 should be determined with such consideration.

As shown in FIG. 8, plasma nitridation 60 is performed to reduce leakage current flowing through the thin gate oxide layer 40 and/or increase the tolerance of the thin gate oxide layer 40 against the penetration of boron. For example, the substrate 10 on which the thick gate oxide layer 50 and the thin gate oxide layer 40 are formed is mounted in a vacuum chamber, and then nitrogen ($N_2$), ammonia ($NH_3$), or both $N_2$ and $NH_3$ are supplied into the vacuum chamber, and a Radio Frequency (RF) field is applied to the vacuum chamber in order to turn $N_2$ or $NH_3$ into a plasma state. An inert gas, such as helium (He) and/or argon (Ar), may be used as a carrier gas. For plasma nitridation 60, remote plasma, decoupled plasma, slot plane antenna and/or electron cyclotron resonance may be used as a plasma source. Besides these, plasma may be obtained from helicon, a parallel plate, transformer coupled plasma called Inductively Coupled Plasma (ICP), through glow discharge and/or other conventional techniques.

If decoupled plasma is used, plasma nitridation 60 may be performed for about 10 to about 80 seconds at a $N_2$ or $NH_3$ pressure maintained at about 5 to about 80 mTorr and without heating the substrate 10. For example, an RF power is set to about 300 W, a pressure is maintained at about 80 mTorr, and He and $N_2$ is supplied at a ratio of about 100 sccm: 100 sccm. If remote plasma is used, plasma nitridation 60 is performed for about 30 to about 120 seconds by setting an RF power within the range of about 1000 W to about 3000 W, keeping a pressure within the range of about 1 to about 5 Torr, and supplying He and $N_2$ at a ratio of about 2900 sccm:500 sccm.

A thick gate oxide layer 50a and a thin gate oxide layer 40a, which have undergone plasma nitridation 60, contain nitrogen atoms, which may result in an increase of a dielectric constant and a reduction of an Equivalent Oxide Thickness (EOT). In particular, reducing the density of leakage current flowing through the thin gate oxide layer 40a in the second area can be achieved. However, for the previously described reasons, the Qbd value and the reliability of the thick gate oxide layer 50a in the first area may tend to decrease.

As shown in FIG. 9, oxidation 70 is performed in an oxygen atmosphere containing hydrogen. The oxidation 70 can restore the reliability of the thick gate oxide layer 50a. Reference numerals 40b and 50b denote a thin gate oxide layer and a thick gate oxide layer, which have been oxidized in the oxygen atmosphere containing hydrogen, respectively. Oxidation 70 may be achieved by mounting the substrate 10 having the thick gate oxide layer 50a and the thin gate oxide layer 40a, which have been plasma nitridized in the step presented in FIG. 8, into the vacuum chamber, making an oxygen atmosphere containing hydrogen of a predetermined percentage, and heating the substrate 10. An ISSG apparatus shown in FIG. 10 may be used for oxidation 70.

For example, the substrate 10 having the thick gate oxide layer 50a and the thin gate oxide layer 40a, which have been plasma nitridized, is mounted into an ISSG apparatus 100. Next, a process 110 of introducing a mixture of hydrogen ($H_2$) and oxygen ($O_2$) at a ratio of about 2%:98% is performed and a lamp 130 is turned on to maintain the temperature of the substrate 10 at about 825° C. Thereafter, oxidation 70 is performed for about 15 seconds. A process 120 of discharging the gas mixture is performed to keep the pressure of the gas mixture at about 12 Torr. Here, the introduction of the gas mixture containing about 2% of hydrogen can be achieved by supplying hydrogen of about 100 sccm and oxygen of about 4900 sccm. In some embodiments, the gas mixture is diluted with $N_2$ and/or an inert gas so as to prevent rapid oxidation. In a case where a gas mixture containing about 1% of hydrogen is used, the temperature of the substrate 10 may be lowered to about 750° C. and oxygen of about 4950 sccm may be supplied with hydrogen of about 50 sccm.

The gas mixture of $H_2$ and $O_2$ is heated by the lamp 130, and then decomposed into $H_2O$ and an oxygen atom. The oxygen atom is a very active oxygen radical (O*). Since oxidation using the oxygen radicals (O*) has an efficient oxidizing power, several defect factors may be rapidly removed. However, the thickness of a gate oxide layer may not greatly increase. Thus, unnecessary oxidation of the substrate 10 can be reduced or minimized while factors of reducing the reliability of the thick gate oxide layer 50a are reduced or eliminated. Also, oxidation using the oxygen radicals has an applicable thermal budget thereto. Moreover, in oxidation using the oxygen radicals, the concentration of nitrogen after plasma nitridation 60 is maintained. Therefore, a good efficiency of plasma nitridation can be maintained in the thin gate oxide layer 40a and the reliability of the thick gate oxide layer 50a can be restored. The thickness of the second gate oxide layer 40, which was formed about 5 Å to about 6 Å thinner than the targeted thin gate oxide layer in the previous step, may increase by about 5 Å to about 6 Å in the present step. As a result, the second gate oxide layer 40b reaches a desired thickness, i.e., a thickness of about 15 Å to about 25 Å.

Figure 11:
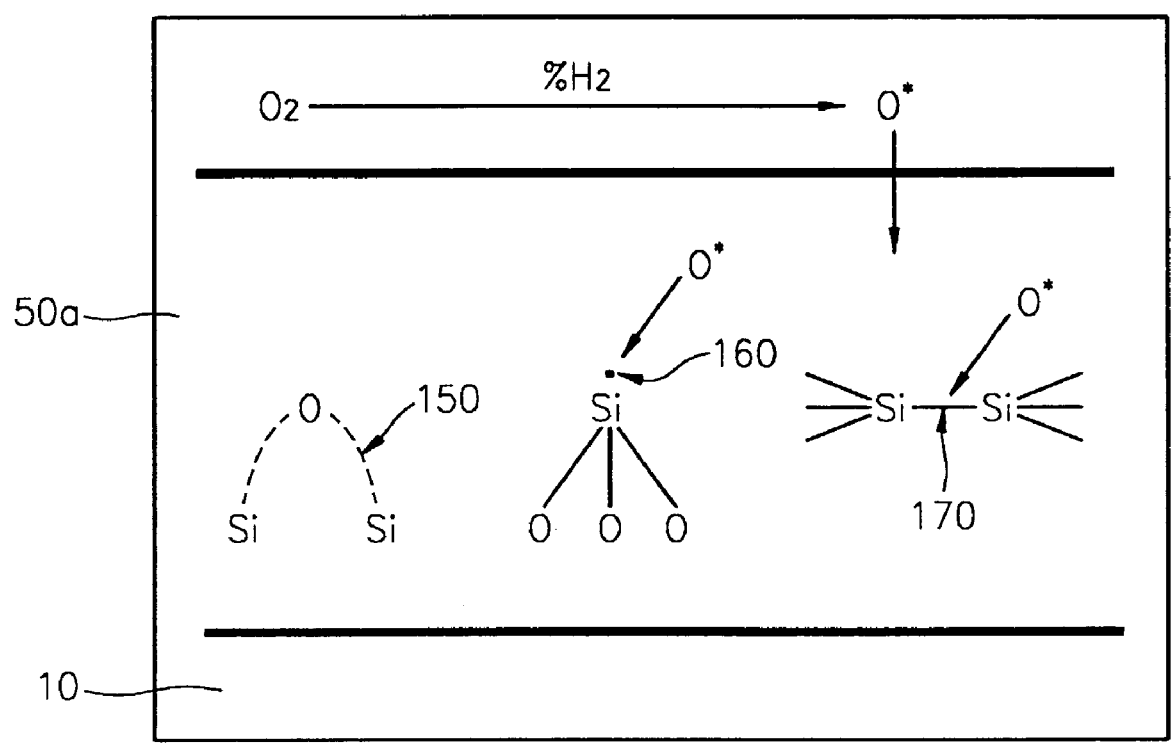
FIG. 11 is a view explaining the effects of oxidation in an oxygen atmosphere containing hydrogen according to some embodiments of the present invention, and its effects on a gate oxide layer.

FIG. 11 illustrates the effects oxidation 70 has on a gate oxide layer, particularly the thick gate oxide layer 50a, in an oxygen atmosphere containing hydrogen according to the present invention. Positive effects of oxygen radicals (O*) created due to the reaction of $H_2$ and $O_2$ on the thick gate oxide layer 50a will be described in detail with reference to FIG. 11. The oxygen radical (O*) participates in a strained Si—O bond 150, a pair of non-shared electrons 160 of silicon, or a bond of silicon and silicon 170, which may be regarded as being defective, or acts in a combination of bivalent nitrogen atoms, so that defects of the thick gate oxide layer 50a are removed. Thus, the oxygen radicals (O*) remove electron trap sites created by theses defects. In addition, when oxidation occurs in the interface between the substrate 10 and the thick gate oxide layer 50a due to the oxygen radicals (O*), it can reduce stress. Therefore, in this process, the reliability of the thick gate oxide layer 50a can be improved. At the same time, the thin gate oxide layer 40a can obtain a desired EOT due to additional oxidation.

Figure 12:
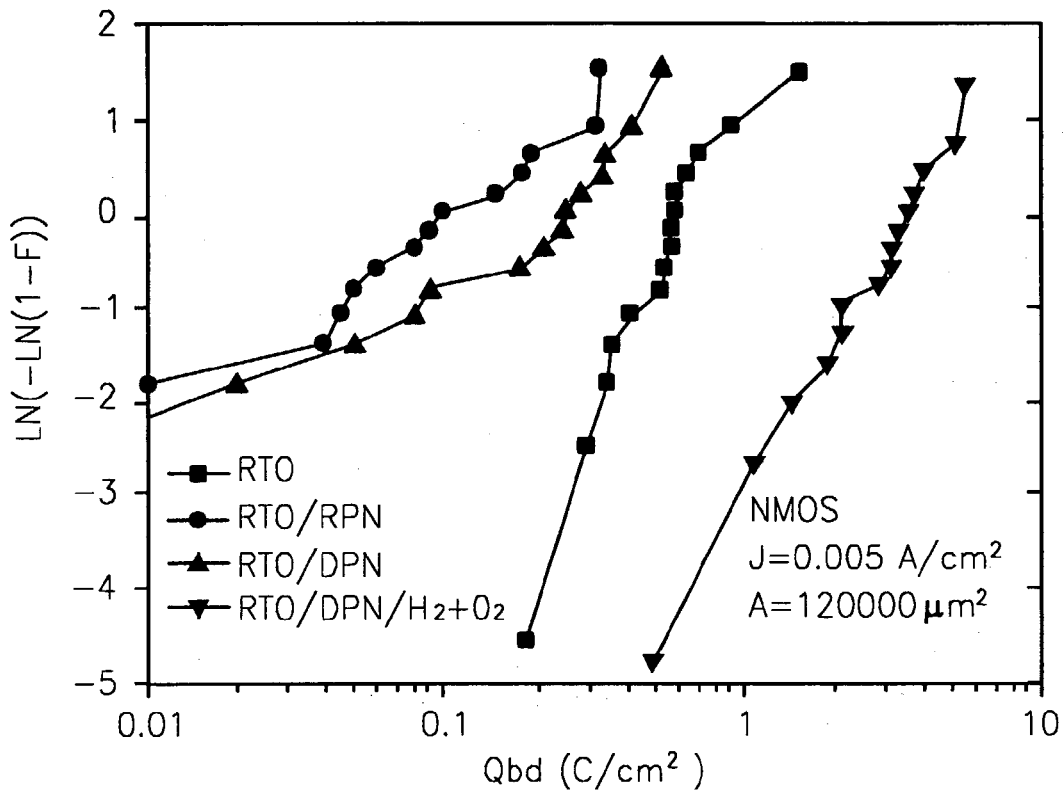
FIG. 12 is a graph illustrating a Qbd value of a thick gate oxide layer according to the prior art and a Qbd value of a thick gate oxide layer according to some embodiments of the present invention measured in an NMOS transistor.
Figure 13:
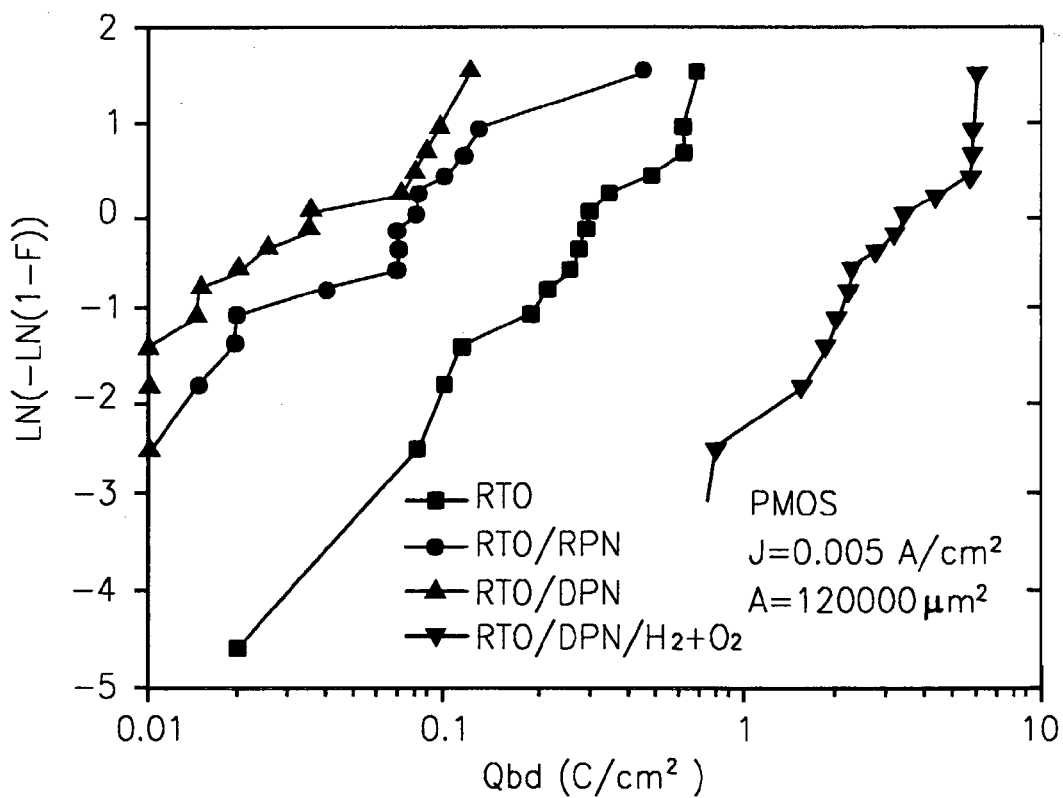
FIG. 13 is a graph illustrating a Qbd value of a thick gate oxide layer according to the prior art and a Qbd value of a thick gate oxide layer according to some embodiments of the present invention measured in a PMOS transistor.

FIGS. 12 and 13 compare a Weibull value of a thick gate oxide layer according to some embodiments of the present invention with a Weibull value of a thick gate oxide layer according to the prior art. FIG. 12 shows a Weibull value of a thick gate oxide layer formed in an NMOS transistor, and FIG. 13 shows a Weibull value of a thick gate oxide layer formed in a PMOS transistor. In FIGS. 12 and 13, the horizontal axis denotes a Qbd value and the vertical axis denotes a Weibull value. A gate current density J is 0.005 $A/cm^2$ and a gate area A is 120000 $\mu m^2$.

In FIGS. 12 and 13, squares (■) represent a case where a thick gate oxide layer was formed to a thickness of about 40 Å using RTO. Circles (●) represent a case where a thick gate oxide layer was formed to a thickness of about 40 Å using RTO and underwent RPN for about 120 seconds. Triangles (▲) represent a case where a thick gate oxide layer was formed to a thickness of about 40 Å using RTO and underwent DPN for about 60 seconds. Inverse triangles (▼) represent a case where a thick gate oxide layer was formed to a thickness of about 40 Å using RTO according to embodiments of the present invention, underwent DPN for about 60 seconds, and then was oxidized for about 15 seconds in an oxygen atmosphere containing hydrogen.

FIGS. 12 and 13 show that the Qbd value of the thick gate oxide layer is reduced to less than $\frac{1}{10}$ after RPN (circles) and DPN (triangles) than before plasma nitridation (squares). However, in both the NMOS and PMOS transistors, the Qbd value of the thick gate oxide layer, which underwent additional oxidation (inverse triangles) in the oxygen atmosphere containing hydrogen according to embodiments of the present invention, increases by 100 times the Qbd value of the thick gate oxide layer after plasma nitridation (circles and triangles). Also, the Qbd value of the thick gate oxide layer increases by 10 times the Qbd value of a pure oxide layer (squares), which does not undergo plasma nitridation. Furthermore, the inclination of the Weibull value of the thick gate oxide layer after RPN and DPN is steeper than the inclination of the Weibull value of the thick gate oxide layer before plasma nitridation. This means that semiconductor devices are broken down at narrower range of Qbd with the higher Qbd value and thus the reliability is improved.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, the present invention may be applied to more than two gate oxide layers as well as to a dual gate oxide layer. In a case where a triple gate oxide layer is to be formed, a first gate oxide layer is formed on a substrate and patterned to expose a portion of the substrate, and a second gate oxide layer is formed on the first gate oxide layer and the exposed portion of the substrate. The second gate oxide layer on the substrate is patterned to expose a portion of the substrate, and then a third gate oxide layer is formed on the second gate oxide layer and the exposed portion of the substrate. Next, plasma nitridation is performed and oxidation is performed in an oxygen atmosphere containing hydrogen. It also will be understood that many other conventional techniques may be used to form a dual gate oxide or a multiple gate oxide layer.

As described above, according to some embodiments of the present invention, the efficiency of a thin gate oxide layer may be improved due to plasma nitridation, and thus the thin gate oxide layer can be suitable for scaling. A good efficiency of plasma nitridation can be maintained and a Qbd value of a thick gate oxide layer can be improved by subsequent oxidation in an oxygen atmosphere containing hydrogen. Without wishing to be bound by any theory of operation, this may be because oxygen radicals generated in the oxygen atmosphere containing hydrogen remove or reduce electron trap sites and stress of the thick gate oxide layer.

Accordingly, in some embodiments of the present invention, a gate oxide layer including a thin gate oxide layer having good electrical characteristics and a thick gate oxide layer having a good reliability can be formed. Therefore, embodiments of the present invention can be advantageously applied to the formation of a dual or multiple gate oxide layers.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming a gate oxide layer, the method comprising:
   (a) forming gate oxide layers having different thicknesses;
   (b) simultaneously plasma nitridizing the gate oxide layers having different thicknesses while maintaining different thicknesses among the gate oxide layers; and
   (c) simultaneously oxidizing the plasma nitridized gate oxide layers having different thicknesses in an oxygen atmosphere containing hydrogen while maintaining different thicknesses among the gate oxide layers, to thereby form plasma nitridized and oxidized gate oxide layers having different thicknesses.

2. The method of claim 1, wherein step (c) is preformed at a temperature between about 700° C. and about 1000° C.

3. The method of claim 1, wherein step (c) is performed at a pressure between several and several tens of Torr.

4. The method of claim 1, wherein step (c) is performed using a gas mixture of hydrogen ($H_2$) and oxygen ($O_2$).

5. The method of claim 4, wherein the gas mixture is diluted with one of nitrogen ($N_2$) and an inert gas.

6. The method of claim 1, wherein step (c) is performed for several to several tens of seconds.

7. The method of claim 1, wherein step (c) is performed using an in situ steam generation apparatus.

8. A method of forming a gate oxide layer, the method comprising:
   (a) forming gate oxide layers having different thicknesses;
   (b) subjecting the gate oxide layers having different thicknesses to plasma nitridation; and
   (c) oxidizing the plasma nitridized gate oxide layers having different thicknesses in an oxygen atmosphere containing hydrogen;
   wherein step (a) comprises:
      forming a first gate oxide layer on a substrate;
      exposing a first portion of the substrate by patterning the first gate oxide layer;
      forming a second gate oxide layer on the first gate oxide layer and the exposed first portion of the substrate;
      exposing a second portion of the substrate by patterning the second gate oxide layer on the substrate; and
      forming a third gate oxide layer on the second gate oxide layer and the second exposed portion of the substrate.

9. The method of claim 8, wherein the third gate oxide layer is formed about 5 Å to about 6 Å thinner than a target thickness.

10. A method of forming a gate oxide layer, the method comprising:
    (a) forming a first gate oxide layer on a substrate;
    (b) exposing a portion of the substrate by patterning the first gate oxide layer;
    (c) forming a second gate oxide layer on the first gate oxide layer and on the exposed portion of the substrate;
    (d) subjecting the first and second gate oxide layers to plasma nitridation; and
    (e) oxidizing the plasma nitridized first and second gate oxide layers in an oxygen atmosphere containing hydrogen.

11. The method of claim 10, wherein step (e) is performed for several to several tens of seconds at a temperature between about 700° C. and about 1000° C. and at a pressure between several and several tens of Torr using a gas mixture of hydrogen and oxygen.

12. The method of claim 11, wherein the gas mixture is diluted with one of nitrogen and an inert gas.

13. The method of claim 11, wherein step (e) is performed using an in situ steam generation apparatus.

14. The method of claim 10, wherein the second gate oxide layer is formed about 5 Å to about 6 Å thinner than a target thickness.

15. The method of claim 10, wherein the second gate oxide layer is formed to a thickness of about 10 Å to about 19 Å, the thickness of a portion where the second gate oxide layer is stacked on the first gate oxide layer is about 35 Å to about 45 Å, and step (e) is performed until the thickness of the second gate oxide layer reaches about 15 Å to about 25 Å.

* * * * *